US010629261B2

(12) United States Patent
Pirovano et al.

(10) Patent No.: US 10,629,261 B2
(45) Date of Patent: Apr. 21, 2020

(54) ENHANCING NUCLEATION IN PHASE-CHANGE MEMORY CELLS

(71) Applicant: Micron Technology, Inc., Boise, ID (US)

(72) Inventors: Agostino Pirovano, Milan (IT); Fabio Pellizzer, Boise, ID (US); Anna Maria Conti, Milan (IT); Davide Fugazza, Sunnyvale, CA (US); Johannes A. Kalb, Portland, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/372,010

(22) Filed: Apr. 1, 2019

(65) Prior Publication Data

US 2019/0295642 A1   Sep. 26, 2019

Related U.S. Application Data

(63) Continuation of application No. 15/980,480, filed on May 15, 2018, now Pat. No. 10,276,235, which is a (Continued)

(51) Int. Cl.
*G11C 13/00* (2006.01)
*G11C 7/04* (2006.01)

(52) U.S. Cl.
CPC ...... *G11C 13/0004* (2013.01); *G11C 13/0069* (2013.01); *G11C 7/04* (2013.01); (Continued)

(58) Field of Classification Search
CPC combination set(s) only.
See application file for complete search history.

(56) References Cited

U.S. PATENT DOCUMENTS 6,570,784 B2   5/2003   Lowrey
8,773,899 B2 * 7/2014   Chen ............... G11C 11/5678
                                                      365/148
(Continued)

FOREIGN PATENT DOCUMENTS

CN   107077888 A   8/2017
JP   2005063647 A   3/2005
(Continued)

OTHER PUBLICATIONS

"European Application Serial No. 15819343.3, Extended European Search Report dated Feb. 23, 2018", 11 pgs.
(Continued)

*Primary Examiner* — Mohammed A Bashar
(74) *Attorney, Agent, or Firm* — Schwegman Lundberg & Woessner, P.A.

(57) ABSTRACT

Various embodiments disclosed herein comprise methods and apparatuses for placing phase-change memory (PCM) cells of a memory array into a temperature regime where nucleation probability of the PCM cells is enhanced prior to applying a subsequent SET programming signal. In one embodiment, the method includes applying a nucleation signal to the PCM cells to form nucleation sites within the memory array where the nucleation signal has a non-zero rising-edge. A programming signal is subsequently applied to achieve a desired level of crystallinity within selected ones of the plurality of PCM cells. Additional methods and apparatuses are also described.

21 Claims, 9 Drawing Sheets

Related U.S. Application Data continuation of application No. 15/154,410, filed on May 13, 2016, now Pat. No. 9,990,989, which is a continuation of application No. 14/328,536, filed on Jul. 10, 2014, now Pat. No. 9,343,149.

(52) U.S. Cl.
CPC ................ *G11C 2013/0083* (2013.01); *G11C 2013/0092* (2013.01)

(56) References Cited

U.S. PATENT DOCUMENTS

| | | | |
|---|---|---|---|
| 9,343,149 | B2 | 5/2016 | Pirovano et al. |
| 9,990,989 | B2 | 6/2018 | Pirovano et al. |
| 10,276,235 | B2 | 4/2019 | Pirovano et al. |
| 2003/0002332 | A1 | 1/2003 | Lowrey |
| 2006/0181931 | A1 | 8/2006 | Ha et al. |
| 2008/0180990 | A1 | 7/2008 | Lung |
| 2009/0027975 | A1 | 1/2009 | Kang et al. |
| 2009/0040814 | A1 | 2/2009 | Kang et al. |
| 2009/0279350 | A1 | 11/2009 | Chen et al. |
| 2009/0310401 | A1 | 12/2009 | Philipp et al. |
| 2010/0182826 | A1 | 7/2010 | Czubatyj |
| 2010/0226168 | A1 | 9/2010 | Savransky |
| 2011/0134685 | A1 | 6/2011 | Kau et al. |
| 2011/0317480 | A1* | 12/2011 | Lung .................. G11C 13/0004 365/163 |
| 2012/0147667 | A1 | 6/2012 | Chen |
| 2012/0250403 | A1 | 10/2012 | Wang et al. |
| 2012/0294074 | A1 | 11/2012 | Hurkx et al. |
| 2013/0107605 | A1 | 5/2013 | Chen |
| 2013/0223163 | A1 | 8/2013 | Chen |
| 2013/0301337 | A1 | 11/2013 | Kamalanathan et al. |
| 2014/0133222 | A1 | 5/2014 | Hewak et al. |
| 2016/0012888 | A1 | 1/2016 | Pirovano et al. |
| 2016/0254050 | A1 | 9/2016 | Pirovano et al. |
| 2018/0268899 | A1 | 9/2018 | Pirovano et al. |

FOREIGN PATENT DOCUMENTS

| | | |
|---|---|---|
| JP | 2007294638 | 11/2007 |
| JP | 2013046010 | 3/2013 |
| WO | 2007046130 | 4/2007 |
| WO | WO-2016007376 A1 | 1/2016 |

OTHER PUBLICATIONS

"European Application Serial No. 15819343.3, Response filed Sep. 6, 2017 to Communication pursuant to Rules 161(2) and 162 EPC dated Mar. 1, 2017", 16 pgs.
"International Application Serial No. PCT/US2015/039025, International Preliminary Report on Patentability dated Jul. 29, 2016", 9 pgs.
"International Application Serial No. PCT/US2015/039025, International Search Report dated Sep. 23, 2015", 3 pgs.
"International Application Serial No. PCT/US2015/039025, Written Opinion dated Sep. 23, 2015", 8 pgs.
"Japanese Application Serial No. 2017-500853, Office Action dated Mar. 13, 2018", w/ English translation, 11 pgs.
"Japanese Application Serial No. 2017-500853, Response filed Aug. 13, 2018 to Office Action dated Mar. 13, 2018", w/ English Claims, 22 pgs.
Loke, D., et al., "Breaking the Speed Limits of Phase Change Memory", Science, 336(6088), (Jun. 22, 2012), 1566-1569.
U.S. Appl. No. 14/328,536, Non Final Office Action dated May 22, 2015, 15 pgs.
U.S. Appl. No. 14/328,536, Response filed Aug. 21, 2015 to Non Final Office Action dated May 22, 2015, 12 pgs.
U.S. Appl. No. 14/328,536, Final Office Action dated Sep. 15, 2015, 20 pgs.
U.S. Appl. No. 14/328,536, Response filed Nov. 16, 2015 to Final Office Action dated Sep. 15, 2015, 13 pgs.
U.S. Appl. No. 14/328,536, Advisory Action dated Nov. 27, 2015, 3 pgs.
U.S. Appl. No. 14/328,536, Notice of Allowance dated Jan. 20, 2016, 7 pgs.
U.S. Appl. No. 15/154,410, Preliminary Amendment filed Aug. 10, 2016, 7 pgs.
U.S. Appl. No. 15/154,410, Non Final Office Action dated Oct. 6, 2016, 17 pgs.
U.S. Appl. No. 15/154,410, Response filed Jan. 6, 2017 to Non Final Office Action dated Oct. 6, 2016, 12 pgs.
U.S. Appl. No. 15/154,410, Final Office Action dated Apr. 7, 2017, 14 pgs.
U.S. Appl. No. 15/154,410, Response filed Jul. 7, 2017 to Final Office Action dated Apr. 7, 2017, 11 pgs.
U.S. Appl. No. 15/154,410, Examiner Interview Summary dated Aug. 23, 2017, 2 pgs.
U.S. Appl. No. 15/154,410, Non-Final Office Action dated Sep. 7, 2017, 16 pgs.
U.S. Appl. No. 15/154,410, Response filed Dec. 7, 2017 to Non Final Office Action dated Sep. 7, 2017, 10 pgs.
U.S. Appl. No. 15/154,410, Notice of Allowance dated Feb. 9, 2018, 8 pgs.
U.S. Appl. No. 15/980,480, Presliminary Amendment filed Jun. 6, 2018, 6 pgs.
U.S. Appl. No. 15/980,480, Non Final Office Action dated Aug. 24, 2018, 13 pgs.
U.S. Appl. No. 15/980,480, Response filed Nov. 26, 2018 to Non Final Office Action dated Aug. 24, 2018, 11 pgs.
U.S. Appl. No. 15/980,480, Notice of Allowance dated Dec. 17, 2018, 8 pgs.
U.S. Appl. No. 15/980,480, Notice of Allowability dated Feb. 21, 2019, 2 pgs.
U.S. Appl. No. 15/980,480, Notice of Allowability dated Mar. 12, 2019, 2 pgs.
U.S. Appl. No. 15/980,480, Notice of Allowability dated Mar. 27, 2019, 2 pgs.
U.S. Appl. No. 14/328,536 U.S. Pat. No. 9,343,149, filed Jul. 10, 2014, Enhancing Nucleation in Phase-Chang Memmory Cells.
U.S. Appl. No. 15/154,410 U.S. Pat. No. 9,990,989, filed May 13, 2016, Enhancing Nucleation in Phase-Change Memory Cells.
U.S. Appl. No. 15/980,480 U.S. Pat. No. 10,276,235, filed May 15, 2018, Enhancing Nucleation in Phase-Change Memory Cells.
"European Application Serial No. 19179279.5, Extended European Search Report dated Aug. 20, 2019", 9 pgs.
"Japanese Application Serial No. 2018-192718, Notification of Reasons for Refusal dated Oct. 23, 2019", w English Translation, 8 pgs.
"Chinese Application Serial No. 201580043320.8, Office Action dated Jan. 9, 2020", w/ English translation, 21 pgs.

* cited by examiner

ENHANCING NUCLEATION IN PHASE-CHANGE MEMORY CELLS

PRIORITY APPLICATION

This application is a continuation of U.S. application Ser. No. 15/980,480, filed May 15, 2018, issued as U.S. Pat. No. 10,276,235, which is a continuation of U.S. application Ser. No. 15/154,410, filed May 13, 2016, now issued as U.S. Pat. No. 9,990,989, which is a continuation of U.S. application Ser. No. 14/328,536, filed Jul. 10, 2014, now issued as U.S. Pat. No. 9,343,149, all of which are incorporated herein by reference in their entireties.

BACKGROUND

Computers and other electronic systems, for example, digital televisions, digital cameras, and cellular phones, often have one or more memory devices to store information. Increasingly, memory devices having multi-level cells (MLC), such as phase-change memory devices, are employed to achieve a higher density of storage capacity. However, phase-change memory devices may vary during manufacture. Therefore, a methodology is needed to properly set and reset memory devices that are in an array while minimizing program times, thereby increasing memory speed and decreasing power consumption while increasing overall product performance.

DETAILED DESCRIPTION

Figure 1:
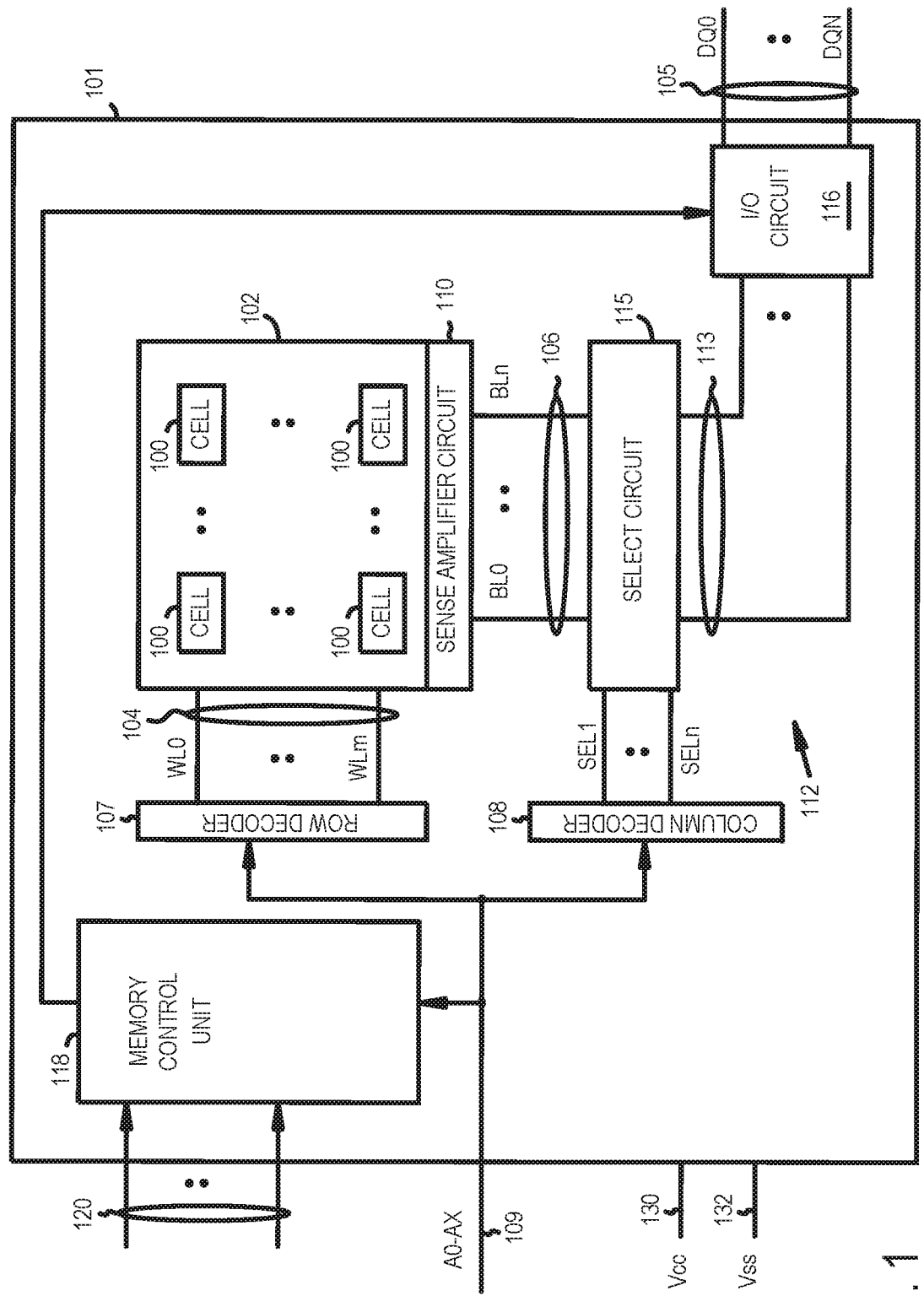
FIG. 1 shows a block diagram of a memory device having a memory array with memory cells, according to an embodiment.

The description that follows includes illustrative apparatuses (circuitry, devices, structures, systems, and the like) and methods (e.g., processes, protocols, sequences, techniques, and technologies) that embody various aspects of the subject matter disclosed herein. In the following description, for purposes of explanation, numerous specific details are set forth in order to provide an understanding of various embodiments of the inventive subject matter. It will be evident, however, to those skilled in the art that various embodiments of the inventive subject matter may be practiced without these specific details. Further, well-known apparatuses and methods have not been shown in detail so as not to obscure the description of various embodiments.

As used herein, the term "or" may be construed in an inclusive or exclusive sense. Additionally, although various embodiments discussed below may primarily focus on multi-level cells (MLC), such as phase-change memory devices, the embodiments are merely given for clarity of disclosure, and thus, are not limited to apparatuses in the form of MLC memory devices or even to memory devices in general. As an introduction to the subject, a few embodiments will be described briefly and generally in the following paragraphs, and then a more detailed description, with reference to the figures, will ensue.

A working principle of phase-change memory (PCM) cells is based on a capability of the cells to reversibly switch between an amorphous and a crystalline phase by means of relatively fast electrical signals, or pulses. In an actual PCM cell, the cell is switched between a crystalline-like low-resistance state (SET state), where at least a large part of the volume of the phase-change material is in the crystalline phase, to an amorphous high-resistance state (RESET state), where the volume of the phase-change material is either partially or fully amorphized. Currently, the crystallization mechanism that governs the amorphous-to-crystalline transition represents a primary limiting factor for an overall programming speed of any PCM-based technology. The overall programming speed relates directly to the operational bandwidth of a memory array comprising PCM cells.

The crystallization process for a phase-change material is usually described through the competitive actions of two distinct mechanisms. Without being bound by theory, it is generally accepted that crystallization takes place through different processes. A first process, called crystal nucleation, corresponds to the spontaneous creation of one or more single small crystals inside the amorphous material or materials. The crystal nucleation mechanism is usually dominant in a low temperature regime close to the glass transition. A second crystallization process is generally referred to crystal growth. During the crystal growth process, a size of existing crystal regions increases over amorphous regions. The crystal growth process is usually dominant at temperatures higher than the crystal nucleation mechanism. The crystal growth process further requires the existence of a crystalline or nucleation region to start the growth process. Each of these mechanisms is described in more detail, below.

To a first order, phase-change memory cells may alternatively be considered as resistance-change memory cells, chalcogenide random-access memory, phase-change random-access memory, and various other terms used throughout the industry. Sometimes various ones of these terms are used interchangeably; other times one term may be a variation of the other. Therefore, for brevity of notation, the term phase-change memory (PCM) cells will be referred to herein to refer to any type of resistance change memory cell that may be programmed based on applying a voltage or current to alter a resistance of t memory cell.

As explained in more detail below, and as is known to a person of ordinary skill in the art, there is a balancing that occurs when programming PCM cells between crystallization speed (how long does it take to program a cell) and data retention of the cell (how long are the data within the cell stable). In general, a. SET signal applied to a cell (the kinetics of this process are described in more detail below) relies on at least partial crystallization of the phase-change material within the PCM cell. An amount of crystallization determines an overall resistivity of the cell. As the cell progresses from fully amorphous (a RESET state) to various levels of crystallization (corresponding to various SET states), the resistivity of the cell decreases. As noted above, the PCM cells may be reversibly switched between the various SET states and the RESET state. However, the crystallization speed is usually much slower than the amorphization speed. Consequently, an overall programming speed of each of the individual PCM cells is limited by how quickly the phase-change material can crystallize.

As also discussed briefly above, nucleation or crystallization theory of PCM cells indicates that crystallization occurs as a two-step process. The phase-change material first forms tiny stable crystals by a process called crystal nucleation when a signal is applied. The tiny crystals then begin to grow (crystal growth), eventually to a fully crystalline structure. However, a nucleation rate is faster at lower temperatures compared to those temperatures that are needed to grow the crystal to larger size (maximum of growth velocity is usually at higher temperature than maximum of nucleation rate). The final crystallization (crystal growth) occurs more rapidly at higher temps (but below the melting temperature of the phase-change material). Further, because of manufacturing tolerances in fabricating PCM devices, the exact temperature required for optimal nucleation cannot be determined a priori as each cell may have a slightly different peak nucleation temperature. Therefore, one guideline of the inventive subject matter as is described herein is to provide a signal with a finite rise time to manage cell-to-cell manufacturing variability while still providing an increase in overall programming speed due to forming the nucleation sites within the phase-change material.

However, as will be readily understood by a skilled artisan, PCM cells are typically used in arrays of memory that may be programmed or read individually or in groups. Therefore, an overview of a simplified block diagram of a memory device having a memory array with memory cells, along with various selection mechanisms, and a schematic representation of a PCM cell are discussed prior to a detailed description of the various nucleation and programming methods and techniques of the inventive subject matter discussed herein.

For example, with reference to FIG. 1, a block diagram of an apparatus in the form of a memory device 101 is shown. The memory device 101 includes one or more memory arrays 102 having a number (e.g., one or more) of memory cells 100 according to an embodiment. The memory cells 100 can be arranged in rows and columns along with access lines 104 (e.g., wordlines to conduct signals WL0 through WLm) and first data lines 106 (e.g., hit lines to conduct signals BL0 through BLn). The memory device 101 can use the access lines 104 and the first data lines 106 to transfer information to and from the memory cells 100. A row decoder 107 and a column decoder 108 decode address signals A0 through AX on address lines 109 to determine which ones of the memory cells 100 are to be accessed.

Sense circuitry, such as a sense amplifier circuit 110, operates to determine the values of information read from the memory cells 100 in the form of signals on the first data lines 106. The sense amplifier circuit 110 can also use the signals on the first data lines 106 to determine the values of information to be written to the memory cells 100.

The memory device 101 is further shown to include circuitry 112 to transfer values of information between the memory array 102 and input/output (I/O) lines 105. Signals DQ0 through DQN on the I/O lines 105 can represent values of information read from or to be written into the memory cells 100. The I/O lines 105 can include nodes within the memory device 101 (or alternatively, pins, solder balls, or other interconnect technologies such as controlled collapse chip connection (C4), or flip chip attach (FCA)) on a package where the memory device 101 resides. Other devices external to the memory device 101 (e.g., a memory controller or a processor, not shown in FIG. 1) can communicate with memory device 101 through the I/O lines 105, the address lines 109, or the control lines 120.

The memory device 101 can perform memory operations, such as a read operation, to read values of information from selected ones of the memory cells 100 and a programming operation (also referred to as a write operation) to program (e.g., to write) information into selected ones of the memory cells 100. The memory device 101 can also perform a memory erase operation to clear information from some or all of the memory cells 100.

A memory control unit 118 controls memory operations using signals on the control lines 120. Examples of the signals on the control lines 120 can include one or more clock signals and other signals to indicate which operation (e.g., a programming or read operation) the memory device 101 can or should perform. Other devices external to the memory device 101 (e.g., a processor or a memory controller) cart control the values of the control signals on the control lines 120. Specific combinations of values of the signals on the control lines 120 can produce a command (e.g., a programming, read, or erase command) that can cause the memory device 101 to perform a corresponding memory operation (e.g., a program, read, or erase operation).

Although various embodiments discussed herein use examples relating to a single-bit memory storage concept for ease in understanding, the inventive subject matter can be applied to numerous multiple-bit schemes as well. For example, each of the memory cells 100 can be programmed to a different one of at least two data states to represent, for example, a value of a fractional bit, the value of a single bit or the value of multiple bits such as two, three, four, or a higher number of bits, each associated with a range of resistance values in a phase-change memory device.

For example, each of the memory cells 100 cart be programmed to one of two data states to represent a binary value of "0" or "1" in a single bit. Such a cell is sometimes called a single-level cell (SLC).

In another example, each of the memory cells 100 can be programmed to one of more than two data states to represent a value of, for example, multiple bits, such as one of four possible values "00," "01," "10," and "11" for two bits, one of eight possible values "000," "001," "010," "011," "100," "101," "110," and "111" for three bits, or one of another set of values for larger numbers of multiple bits. A cell that can be programmed to one of more than two data states is sometimes referred to as a multi-level cell (MLC). Various operations on these types of cells are discussed in more detail, below.

The memory device 101 can receive a supply voltage, including supply voltage signals $V_{cc}$ and $V_{ss}$, on a first supply line 130 and a second supply line 132, respectively. Supply voltage signal $V_{ss}$ can, for example, be at a ground potential (e.g., having a value of approximately zero volts). Supply voltage signal $V_{cc}$ can include an external voltage supplied to the memory device 101 from an external power source such as a battery or alternating-current to direct-current (AC-DC) converter circuitry (not shown in FIG. 1).

The circuitry 112 of the memory device 101 is further shown to include a select circuit 115 and an input/output (I/O) circuit 116. The select circuit 115 can respond to signals SEL1 through SELn to select signals on the first data lines 106 and the second data lines 113 that can represent the values of information to be read from or to be programmed into the memory cells 100. The column decoder 108 can selectively activate the SEL1 through SELn signals based on the A0 through AX address signals on the address lines 109. The select circuit 115 can select the signals on the first data lines 106 and the second data lines 113 to provide communication between the memory array 102 and the I/O circuit 116 during read and programming operations.

The memory device 101 may comprise a non-volatile memory device and the memory cells 100 can include non-volatile memory cells such that the memory cells 100 can retain information stored therein when power (e.g., $V_{cc}$, $V_{ss}$, or both) is disconnected from the memory device 101.

Each of the memory cells 100 can include a memory element having material, at least a portion of which can be programmed to a desired data state (e.g., by storing a corresponding amount of charge on a charge storage structure, such as a floating gate or charge trap, or by being programmed to a corresponding resistance value). Different data states can thus represent different values of information programmed into each of the memory cells 100.

The memory device 101 can perform a programming operation when it receives (e.g., from an external processor or a memory controller) a programming command and a value of information to be programmed into one or more selected ones of the memory cells 100. Based on the value of the information, the memory device 101 can program the selected memory cells to appropriate data states to represent the values of the information to be stored therein.

One of ordinary skill in the art may recognize that the memory device 101 may include other components, at least some of which are discussed herein. However, several of these components are not shown in the figure, so as not to obscure details of the various embodiments described. The memory device 101 may include devices and memory cells, and operate using memory operations (e.g., programming and erase operations) similar to or identical to those described below with reference to various other figures and embodiments discussed herein.

Figure 2:
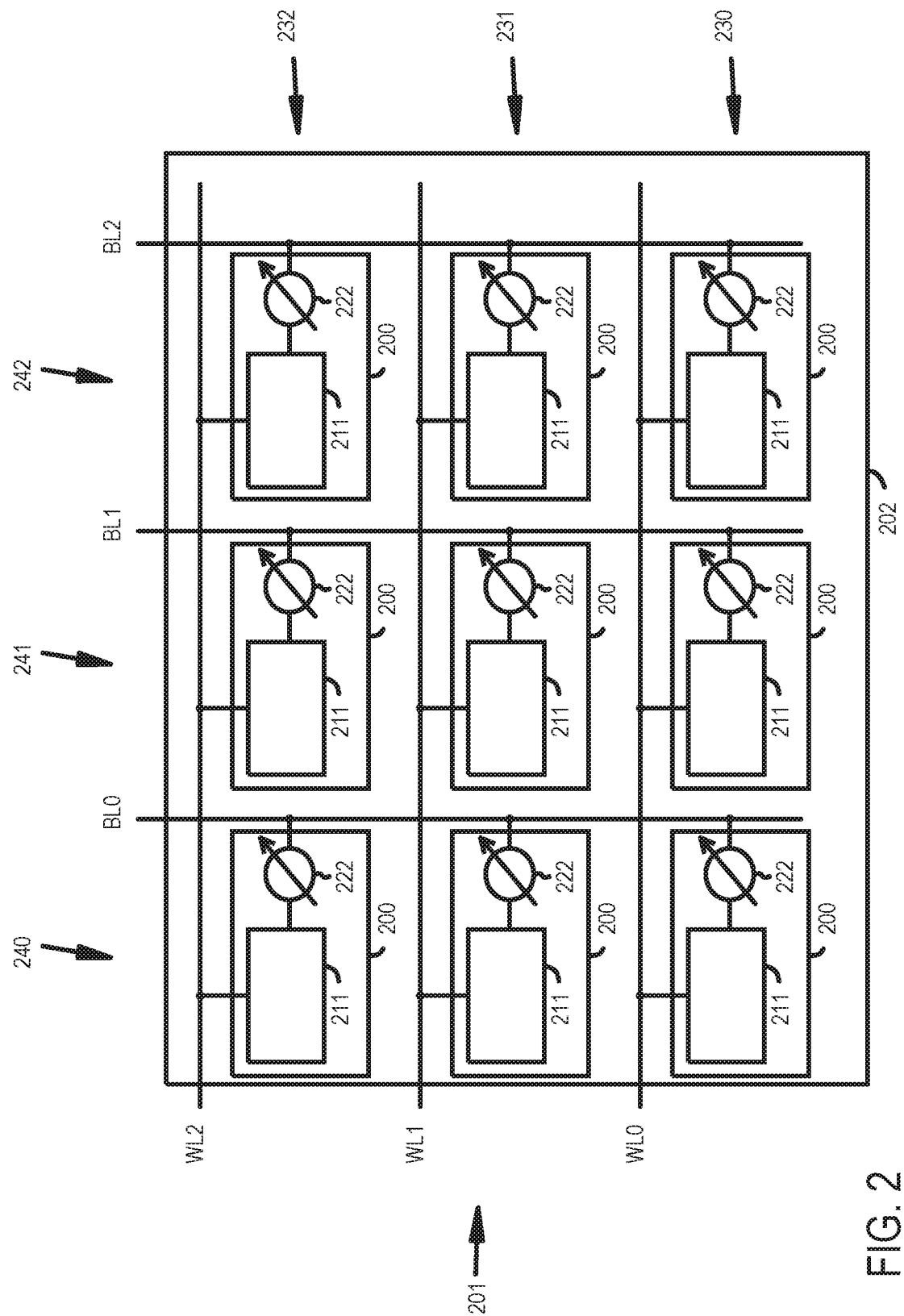
FIG. 2 shows a partial block diagram of a memory device having a memory array including memory cells with access components and memory elements, according to an embodiment.

With reference now to FIG. 2, a partial block diagram of an apparatus in the form of a memory device 201 is shown to include a memory array 202, including memory cells 200 with access components 211 and memory elements 222, according to an example embodiment. The memory array 202 may be similar or identical to the memory array 102 of FIG. 1. As further shown in FIG. 2, the memory cells 200 are shown to be arranged in a number of rows 230, 231, 232, along with access lines, for example word lines, to conduct signals such as signals WL0, WL1, and WL2. The memory cells are also shown to be arranged in a number of columns 240, 241, 242 along with data lines, for example bit lines, to conduct signals such as signals BL0, BL1, and BL2. The access components 211 can turn on (e.g., by using appropriate values of signals WL0, WL1, and WL2) to allow access, along with signals BL0, BL1, and BL2, to the memory elements 222, such as to operate the memory elements as pass elements, or to read information from or program (e.g., write) information into the memory elements 222.

Programming information into the memory elements 222 can include causing the memory elements 222 to have specific resistance values or, alternatively, to store specific amounts of charge. Thus, reading information from a memory cell 200 can include, for example, determining a resistance value of the memory element 222 or determining whether the memory cell 200 is placed in a conductive state in response to a specific voltage being applied to its access component 211. In either case, such a determining act may involve sensing a current (or absence of current) flowing through the memory cell 200 (e.g., by sensing a current of a bit line electrically coupled to the memory cell). Based on a measured value of the current (including, in some examples, whether a current is detected at all), a corresponding value of the information stored in the memory can be determined. The value of information stored in a memory cell 200 can be determined in still other ways, such as by sensing a voltage of a bit line electrically coupled to the memory cell.

Figure 3:
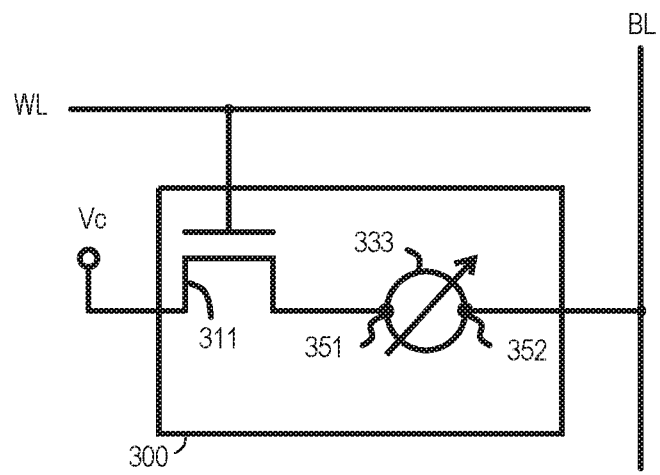
FIG. 3 shows a schematic diagram of a memory cell having an access component coupled to a memory element, according to various embodiments.

FIG. 3 shows a schematic diagram of a memory cell 300 having an access component 311 coupled to a memory element 333, according to various embodiments. Lines labeled WL and BL in FIG. 3 may correspond to any one of the access lines 104 and any one of the first data lines 106 of FIG. 1, respectively. FIG. 3 shows an example of the access component 311 including, for example, a metal-oxide-semiconductor field-effect transistor (MOSFET). As will be realized by a person of ordinary skill in the art, upon reading this disclosure, the memory cell 300 can include other types of access components.

The memory element 333 may be coupled to and disposed between two electrodes, such as a first electrode 351 and a second electrode 352. FIG. 3 schematically shows these electrodes as dots. Structurally, each of these electrodes can include conductive material. The memory element 333 can include material that can be changed, for example, in response to a signal, to have different resistance values. The value of information stored in the memory element can correspond to the resistance value of the memory element. The access component 311 cart enable signals (e.g., embodied as a voltage or current) to be transferred to and from the memory element 333 via the pairs of electrodes during operation of the memory cell, such as during read, program, or erase operations.

A programming operation may use signal WL to turn on the access component 311 and then apply a signal BL (e.g., a signal having a programming voltage or current) through the memory element 333. Such a signal can cause at least a portion of the material of the memory element 333 to change. The change can be reversed by, for instance, performing an erase operation. For example, a localized conductive region may be formed within an electrolyte contained within the memory element 333. The formation of the localized conductive region is discussed in more detail, below, for example, with reference to FIGS. 5A through 5C. The lateral size of the localized conductive region can have different resistance values that can be used to represent different states that represent different values of information stored in the memory element 333. The physical characteristics of the localized conductive region, and hence the memory characteristics of the cell, depend on the attributes of the electronic signal that is used to "set" the cell. For example, a low energy signal may form a "weak" or "fragile" conductive region that is "thin" or lower in conductance, and retains the associated resistance state for only a short duration. In this case, the low energy signal provides a low-power, short-term memory function. In comparison, a higher energy signal may form a "stronger" or thicker conductive region that exhibits longer-term memory retention. In yet another example, a very fast, high power signal may provide a conductive region that is only retained temporarily. In this case, the memory function may be considered volatile and function in a manner analogous to DRAM. Any of the prescribed memory functions may be utilized in conjunction with other memory cells, or regions of memory cells, that furnish differentiated memory functions, based on their program signal attributes.

A read operation may use the signal WL to turn on the access component 311 and then apply a signal BL having a voltage or a current (e.g., a read voltage or current) through the memory element 333. The read operation may measure the resistance of the memory cell 300, based on a read voltage or current, to determine the corresponding value of information stored therein. For example, in the memory cell 300, a different resistance value cart impart a different value (e.g., voltage or current value) to signal BL when a read current passes through the memory elements 333. Other circuitry of the memory device (e.g., a circuit such as the I/O circuit 116 of FIG. 1) can use the signal BL to measure the resistance value of memory element 333 to determine the value of the information stored therein.

The voltage or current used during a read, program, or erase operation can be different from one another. For example, in a programming operation, the value (e.g., the voltage) of the signal (e.g., the signal BL in FIG. 3) that creates a current flowing through the memory element can be sufficient to cause the material of at least a portion of the memory element to change. The change can alter the resistance value of the memory element to reflect the value of the information to be stored in the memory element 333.

In a read operation, the value (e.g., the voltage) of the signal (e.g., the signal BL in FIG. 3) that creates a current flowing through the memory element can be sufficient to create the current but insufficient to cause any portion of the memory element to change. Consequently, the value of the information stored in the memory element can remain unchanged during and after the read operation. Other embodiments may require "refresh" operations, for example, a volatile memory function such as DRAM.

In a generalized erase operation with various types of memory cells, the voltage value of the signal (e.g., the signal BL in FIG. 3) can have an opposite polarity from the voltage used in a programming operation. The signal, creating a current in this case, can therefore change, or reset, the material of the memory element to its original state; for example, to a state prior to any programming being performed on the memory cell.

Various ones or all of the memory cells 100, 200, 300 of FIGS. 1 through 3 can include a memory cell having a structure similar or identical to one or more of the phase-change memory cells described below.

Figure 4:
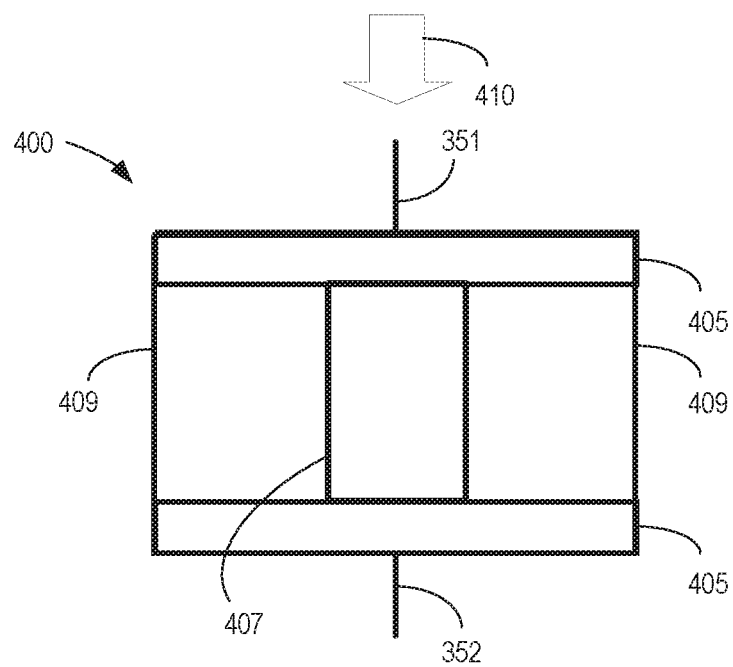
FIG. 4 is a simplified schematic block diagram of one of several phase-change memory (PCM) cell memory elements that may be used with the memory devices of FIGS. 1 and 2, or may comprise the memory cell of FIG. 3.

For example, FIG. 4 shows is a simplified schematic block diagram of one of several phase-change memory cells that may be used with the memory devices of FIGS. 1 and 2, and may be similar to or identical to the memory element 333 of FIG. 3. That is, the memory cell 300 may comprise a phase-change memory (PCM) cell 400. The PCM cell 400 may include conductive elements 405 coupled to a phase-change material 407. The phase-change material 407 may be surrounded on two or more sides by a dielectric material 409. A signal 410 may be applied to the phase-change material 407 through the conductive elements 405.

In a specific exemplary embodiment, suitable materials for the conductive elements 405 include a thin film of titanium (Ti), titanium nitride (TiN titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other conductive materials that are compatible with the phase-change material 407.

The phase-change material 407 comprises a material having electrical properties (e.g., resistance, capacitance, etc.) that may be changed through the application of energy such as, for example, heat, light, voltage potential, or electrical current. Examples of a phase-change material include a chalcogenide material. A chalcogenide alloy may be used in a memory element or in an electronic switch. A chalcogenide material is a material that includes at least one element from column VI of the periodic table or is a material that includes one or more of the chalcogenic elements; for example, any of the elements of tellurium, sulfur, or selenium. In a specific exemplary embodiment, the phase-change material 407 comprises $Ge_2Sb_2Te_5$, also known as Germanium-Antimony-Tellurium, or simply GST.

The dielectric material 409 allows for a relatively small amount of the phase-change material 407 to be used, thus increasing the programming speed of the PCM cell 400 by keeping the volume of the phase-change material 407 to a relatively small level. In various embodiments, the dielectric material 409 may comprise silicon dioxide ($SiO_2$) or silicon nitride ($Si_xN_y$). Additionally, various types of dielectric materials, such as tantalum pentoxide ($Ta_2O_5$), silicon nitride ($Si_xN_y$), aluminum oxide ($Al_2O_3$), tantalum pentoxide ($Ta_2O_5$), hafnium oxide ($HfO_2$), and a variety of other organic or inorganic dielectric materials, may be used as an alternative to or in conjunction with $SiO_2$ or $Si_xN_y$.

The signal 410 that is applied to the phase-change material 407 through the conductive elements 405 is described in various embodiments, below. For example, FIGS. 6A through 6D show graphs of various types of nucleation and/or SET programming signals that include an initial ramp-up signal to provide a crystal nucleation phase (note: the term "nucleation phase" is used with regard to nucleation as a time period, process, or portion of the SET signal) inside the amorphous PCM cells prior to applying either a SET signal to the PCM cells or the remaining portion of the SET signal during which those nucleated crystals grow to larger size. As discussed in more detail with regard to FIG. 9, below, the nucleation signal may either be a separate signal applied prior to a SET signal, or, alternatively, may be part of a continuous nucleation/SET programming signal.

Figure 5A:
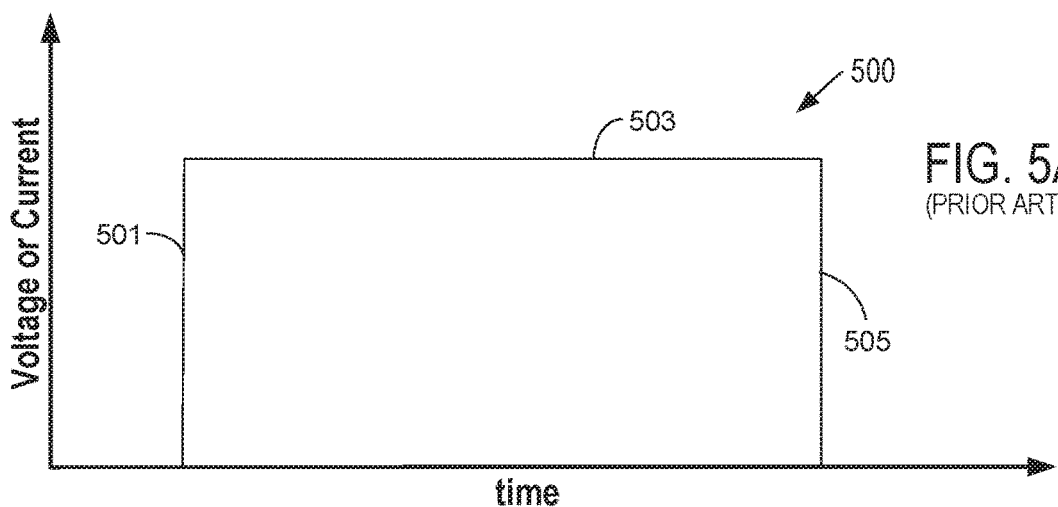
FIGS. 5A through 5C show schematic representations of programming signals of the prior art used to apply a SET to PCM cells.
Figure 5B:
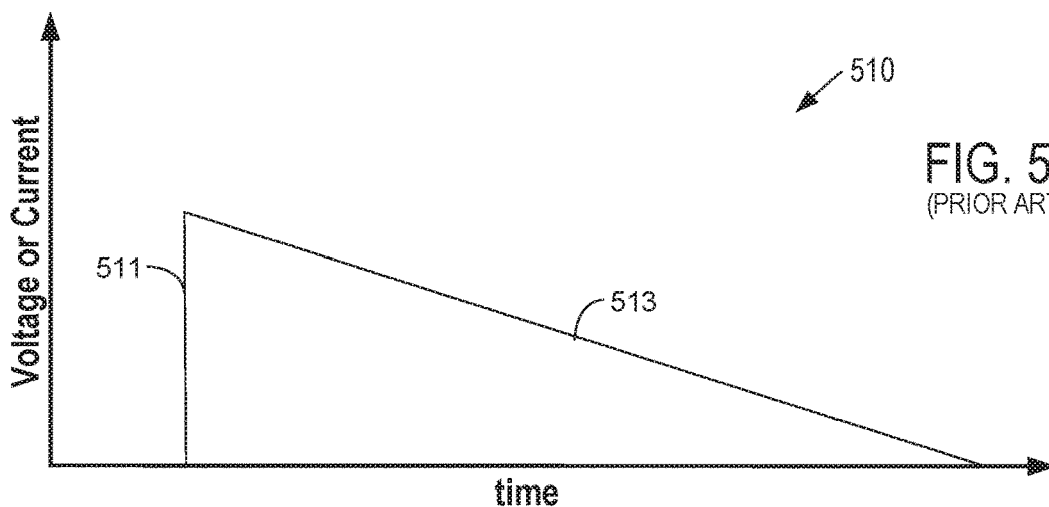
Figure 5C:
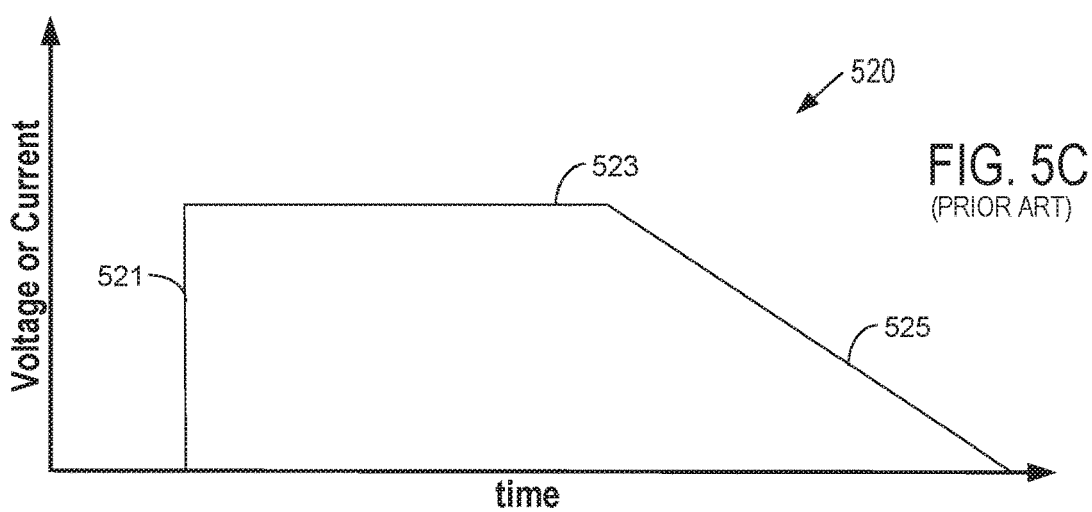

Referring now to FIGS. 5A through 5C, schematic representations of programming signals used by the prior art to apply a SET to PCM cells are shown. For each of the signals shown, either a voltage or current (e.g., a signal) is applied to the PCM cell for a predetermined period of time, where the ramp-up time is nearly instantaneous in all cases. After a maximum amplitude of the signal is achieved, the signal is either maintained at a constant amplitude for a period of time (FIG. 5A), ramped-down over a pre-determined time period (FIG. 5B), or maintained at a constant amplitude for a period of time and then ramped-down over a pre-determined time period (FIG. 5C).

For example, FIG. 5A shows a square signal 500 applied to be applied to the PCM cell. The square signal 500 has a substantially instantaneous rise time 501 on the rising edge of the signal to a pre-determined maximum signal amplitude of voltage or current. The square signal 500 is maintained at a constant signal 503 amplitude or plateau (a non-zero voltage or current) throughout the time duration of the square signal 500 and then returns to zero (or some minimal value of voltage or current) on the trailing edge 505 of the signal. Note that the maximum signal amplitude of voltage or current is typically less than a current level that would induce melting of the phase-change material within the cell. That is, the maximum amplitude of the constant signal 503 is selected to be less than that required to produce a melting current, $I_{melt}$, across the PCM cells to avoid a RESET of the phase-change material. During a RESET, the phase-change material melts (at approximately 900 K) and, due to the rapid return to zero of the trailing edge 505 of the signal, the phase-change material quickly cools and remains in an amorphous state.

FIG. 5B shows a triangular signal 510 with a substantially instantaneous rise time 511 on the rising edge of the signal. After the triangular signal 510 reaches a pre-determined maximum amplitude, the triangular signal 510 then begins a ramp-down trailing-edge 513 to zero, or some minimal value of voltage or current, on the trailing edge of the signal. The ramp-down trailing-edge 513 occurs over a pre-determined time period.

FIG. 5C shows a combined signal 520 having a substantially instantaneous rise time 521 to a predetermined maximum signal height of voltage or current. The combined signal 520 is maintained at a constant signal 523 amplitude or plateau (a non-zero voltage or current) throughout a pre-determined time period of the combined signal 520. The combined signal 520 then begins a ramp-down trailing-edge 525, for another pre-determined time period, to return to zero (or some minimal value of voltage or current) on the trailing edge of the signal.

Unlike the square signal 500 of FIG. 5A, the triangular signal 510 of FIG. 5B or the combined signal 520 of FIG. 5B may either have a maximum signal amplitude either less than or greater than a voltage or current that would induce inching of the phase-change material within the cell. That is, since the signals of both FIGS. 5B and 5C slowly return to zero, the phase-change material may return from an amorphous state to some level of crystallinity.

Each of the prior art programming signals of FIGS. 5A through 5C utilize a nearly instantaneous rising-edge signal applied to the PCM cells. The instantaneous signal is ideally 0, but current practical limitations necessitate an approximately 10 nanosecond (ns) rising-edge on the signal. Consequently, as used herein, the term "non-zero rising-edge signal" shall refer to a deliberate selection of either an analog or a (e.g., digital) step-wise ramped-up signal.

However, in contrast to the various types of signals used by prior art processes in programming a SET signal in a PCM cell as shown in FIGS. 5A through 5C, FIGS. 6A through 6D show schematic representations of signals that may be used as either separate nucleation phase signal or as combined nucleation phase and programming SET signals. As described in more detail below, FIGS. 6A through 6D include an initial ramp-up signal to provide a crystal nucleation phase inside amorphous PCM cells prior to subsequently applying a SET signal to the PCM cells. The signals may also be considered as a combined nucleation and SET signal. As disclosed in more detail below, the nucleation phase increases an overall programming speed of the cell.

For example, one attribute of the subject matter described herein is a programming methodology for PCM cells that includes a nucleation phase and adopts one or more of the signals as shown graphically in FIGS. 6A through 6D. Each of these signals utilize a non-zero ramp-up time or rising edge of the signal that is substantially longer than the practical lower limit of the approximately 10 ns ramp-up time discussed above with regard to FIGS. 5A through 5C.

The non-zero rising edge disclosed herein promotes a crystal nucleation phase or process without prompting a crystallization growth process within the phase-change materials. Consequently, the switching properties of PCM cells is faster (e.g., from either an initial amorphous or nucleation phase to various levels of crystallinity, thereby affecting a resistivity of the cells) due to placing the PCM cells into the nucleation phase (achieved at a temperature of, for example, 420 K) but without activating spontaneous crystallization (at higher temperatures up to the melting temperature) of the phase-change materials within the cells. For example, placing the PCM cells into a nucleation phase appears to be stable in nature, likely due to insufficient thermal energy at the nucleation temperatures described herein to overcome the energy barrier required for diffusion and a concomitant crystallization growth. The switching properties are discussed in more detail, below, with reference to FIG. 7.

With direct reference again to FIGS. 6A through 6D, each signal begins with a non-zero leading edge and, after a maximum amplitude of the signal is achieved, the signal is either maintained at a constant amplitude for a period of time (FIG. 6A), ramped-down over a pre-determined time period (FIG. 6B), maintained at a constant amplitude for a period of time and then ramped-down over a pre-determined time period (FIG. 6C), or ramped-down quickly to zero (or some minimal value of voltage or current as shown in FIG. 6D). Each of the various signals may be used to provide either separate or combined nucleation and/or SET signals as described in more detail herein.

Figure 6A:
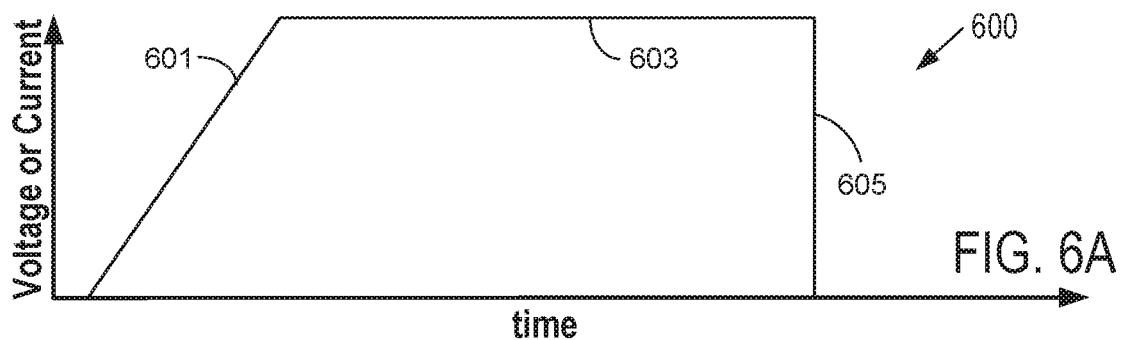
FIGS. 6A through 6D show schematic representations of signals that may be used as either separate nucleation phase signals or that may be considered as combined nucleation phase and subsequently-applied SET programming signals (note: the term "nucleation phase" is used with regard to nucleation as a time period, process, or portion of the SET signal and not as a transition between various changes in material properties)

For example, FIG. 6A shows a rising-edge signal 600 applied to the PCM cell. The rising-edge signal 600 has a non-zero time period in which a ramped rising-edge 601 of the signal raises to a pre-determined maximum signal height of voltage or current. The rising-edge signal 600 is maintained at a constant signal 603 amplitude or plateau (a non-zero voltage or current) throughout the time duration of the rising-edge signal 600 and then returns to zero (or some minimal value of voltage or current) on the trailing edge 605 of the signal. For the rising-edge signal 600, the trailing edge is nearly instantaneous (perhaps occurring over a 10 ns time period based on practical limits of the trailing edge response). Note that the maximum signal height of voltage or current may be selected to be typically less than a current level that would induce either partial or complete melting of the phase-change material within the cell. (A person of ordinary skill in the art will recognize that there may be a temperature gradient through the cell, so no unique melting temperature for each point in the cell should be inferred.) That is, the maximum amplitude of the constant signal 603 amplitude is selected to produce less than the melting current, $I_{melt}$, across the PCM cells to avoid either a partial or a complete RESET of the phase-change material. During a RESET, the phase-change material melts (at approximately 900 K depending on the material chosen) and, due to the rapid return to zero of the trailing edge 605 of the signal, the phase-change material quickly cools and remains in an amorphous state.

Figure 6B:
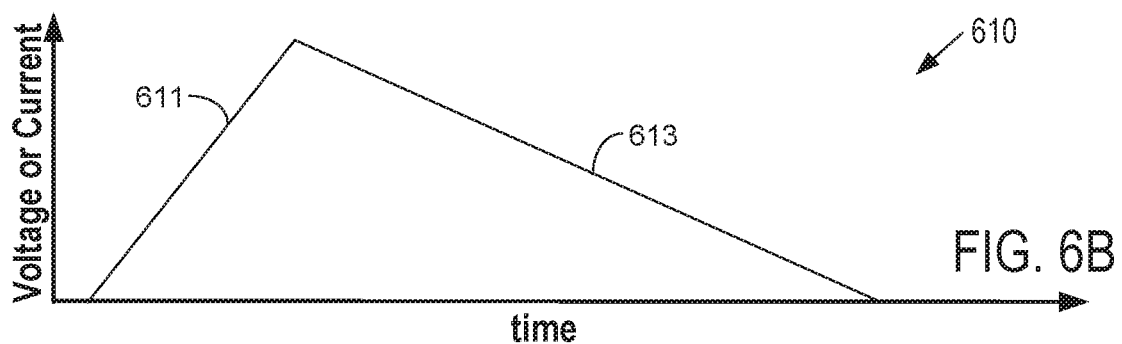

FIG. 6B shows a triangular signal 610 with a non-zero time period in which a ramped rising-edge 611 of the signal raises to a pre-determined maximum signal amplitude of voltage or current. After the triangular signal 610 reaches a pre-determined maximum amplitude, the triangular signal 610 then begins a ramp-down trailing-edge 613 to zero, or some minimal value of voltage or current, on the trailing edge of the signal. The ramp-down trailing-edge 613 occurs over a pre-determined time period.

Figure 6C:
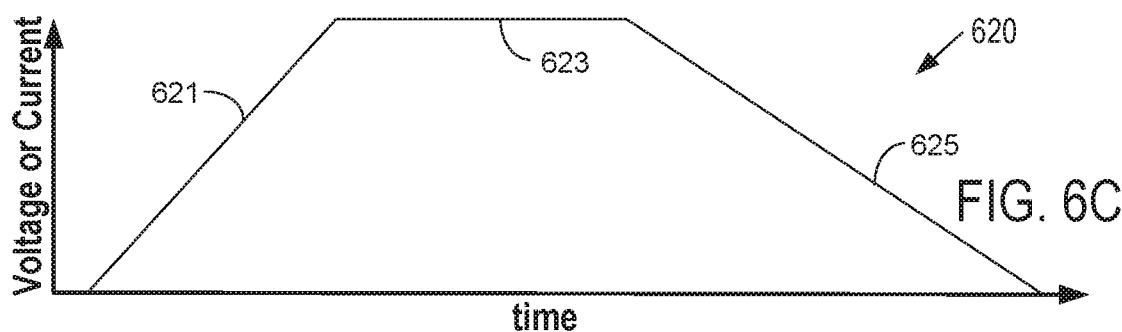

FIG. 6C shows a combined signal 620 having a non-zero time period in which a ramped rising edge 621 of the signal raises to a pre-determined maximum signal amplitude of voltage or current. The combined signal 620 is maintained at a constant signal 623 amplitude or plateau (a non-zero voltage or current) throughout a pre-determined time period of the combined signal 620. The combined signal 620 then begins a ramp-down trailing-edge 625, for another pre-determined time period, to return to zero (or some minimal value of voltage or current) on the trailing edge of the signal.

Figure 6D:
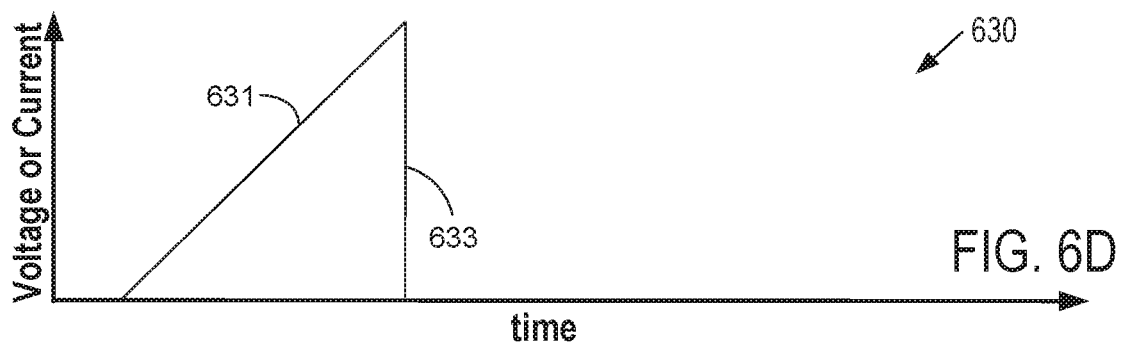

FIG. 6D shows a rising-edge triangular-signal 630 to be applied to the PCM cell. The rising-edge triangular-signal 630 has a non-zero time period in which a ramped rising-edge 631 of the signal raises to a pre-determined maximum signal height of voltage or current. The rising-edge triangular-signal 630 then returns to zero (or some minimal value of voltage or current) on the trailing edge 633 of the signal. For the rising-edge triangular-signal 630, the trailing edge is nearly instantaneous (perhaps occurring over a 10 ns time period based on practical limits of the trailing edge response).

With continuing reference to FIGS. 6A through 6D, an initial nucleation phase period occurs during a portion of the non-zero time period of the ramped rising-edge 601, 611, 621, 631 in each of the signals described in FIGS. 6A through 6D. All four approaches described in FIGS. 6A through 6D, or various combinations thereof, are effective to promote the growth of nucleated crystal seeds. Growing the nucleated crystal seeds may be considered to be a pre-structural ordering of the phase-change materials to prepare for a subsequent crystallization step (to some order of crystallinity and, consequently, resistivity value). Thus, one significant difference with respect to various contemporaneous programming signals used to program PCM cells today is an adoption of a rising-edge signal (e.g., the ramp-up period) in order to promote nucleation of crystal seeds before the signal is continued at a higher amplitude or before a further programming SET signal is applied; both of which are to commence crystalline growth.

Due to manufacturing tolerances and other variables, PCM cells within a PCM cells array will likely include unavoidable process variations. Consequently, the ramped rising-edge 601, 611, 621, 631, of FIGS. 6A through 6D, respectively, may effectively induce nucleation of crystal seeds even in slightly different PCM cells possibly present in a PCM array.

Therefore, partially dependent on a maximum amplitude of the signal, one or more of the four approaches shown in FIGS. 6A through 6D, or combinations thereof, may be chosen in order to minimize an overall signal duration (e.g., as shown in FIG. 6A) or to better manage cell-to-cell variability (e.g., manufacturing tolerances) in terms of the current required for increased crystal growth (e.g., FIG. 6B or FIG. 6C). Consequently, subsequent to the nucleation phase period, a crystal growth process may occur primarily during a plateau of the signal (e.g., FIG. 6A) or during the ramp-down of the signal (e.g., FIG. 6B or FIG. 6C) or during both (e.g., FIGS. 6B and 6C). Accordingly, a lower SET resistance and a better SET resistance distribution (a lower standard deviation of various ones of the memory cells in an array) is obtained if one or more of the signal shapes of FIGS. 6A through 6D is used (compared to the contemporaneous signal shape of FIGS. 5A through 5C).

However, a person of ordinary skill in the art will recognize that, with regard to FIGS. 6A through 6D, neither the magnitude, the slope, nor any particular proportions of the signals should be construed as to limit an exact time duration, magnitude, or shape of the various signals. As will be readily understood by the skilled artisan upon reading and understanding the material disclosed herein, the various figures are offered to provide a better understanding of the various concepts discussed herein. Further, each of the ramped signals may comprise a plurality of stepped-values (e.g., a step-wise incremental signal) as opposed to a continuously-increasing (e.g., an analog signal) ramp-up signal.

Figure 7:
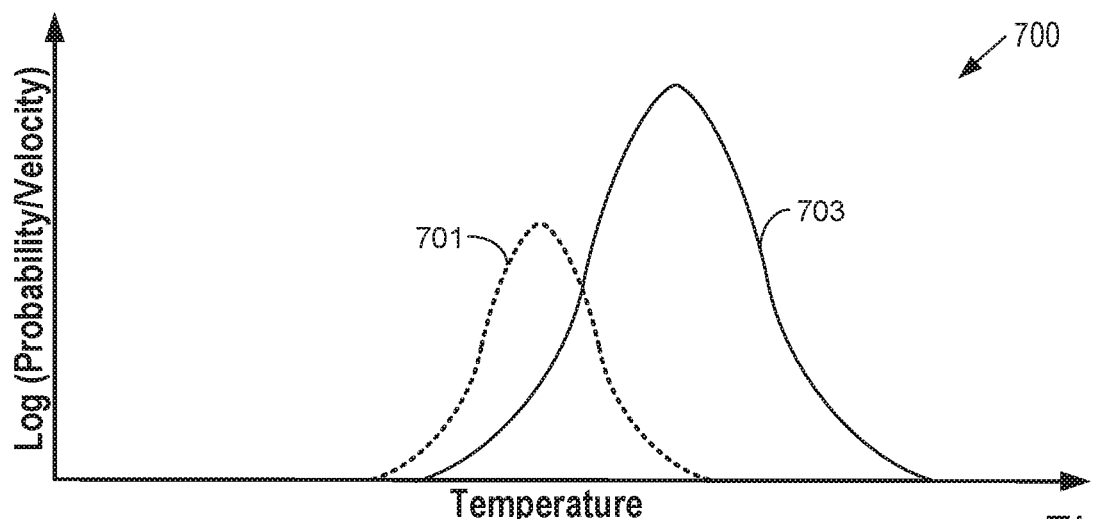
FIG. 7 is a graphical representation showing crystallization probability/growth velocity as a function of temperature for phase-change materials.

FIG. 7 is a graphical representation 700 showing nucleation probability and crystallization growth velocity as a function of temperature for phase-change materials. The graphical representation 700 indicates a calculated probability distribution for a nucleation phase 701 and a crystalline growth phase 703 of a phase-change material, such as the $Ge_2Sb_2Te_5$ alloy, discussed above.

Crystallization in many materials is limited by nucleation. Consequently, nucleation rate of a given material (even at the peak temperature) is so low that nucleation determines a timescale of an overall crystallization process—once and if nucleation occurred, growth will follow more quickly. Especially upon the technology is scaled down (cell size shrinking), nucleation is projected to become increasingly difficult since the nucleation probability (determined as a functions of nucleation rate times cell volume times observation time) decreases with cell volume. The nucleation rate itself is a material parameter and independent of the cell volume. Crystal growth, in contrast to nucleation, becomes easier with scaling since the distance over which the crystal front has to grow decreases with cell size.

It is worth noting that the peak nucleation probability during the nucleation phase 701 typically occurs at lower temperature than the peak crystal growth velocity and is dominant in the low-temperature regime (e.g., at 420 K or some other temperature selected to be less than a peak crystallization temperature). In contrast, the crystalline growth phase 703 provides a higher crystallization speed but, also, the crystalline growth phase 703 occurs primarily at higher temperatures (e.g., at temperatures closer to the melting temperature of the alloy, which is approximately 900 K for $Ge_2Sb_2Te_5$).

The formation of the nucleation sites during the nucleation phase 701 can be considered to be a pre-structural ordering of the molecules within the phase-change material. That is, as opposed to proceeding from fully amorphous to various levels of crystallinity of the phase-change materials, the pre-structural ordering of the molecules within the chosen PCM alloy allows for a faster phase change of the phase-change material into various levels of crystallinity.

In general, the extension of the amorphized and crystalline region inside a cell depends on the specific architecture employed. In standard PCM devices, a cell active region consists in an amorphous dome, usually surrounded by a phase-change material that remains in the crystalline phase. However, in other types of cell architectures, the active region extends to the whole phase-change material volume. Therefore, the second type of cells may need to work with a RESET state that corresponds to a fully amorphous phase-change material (a full-volume amorphization). Thus, an exact determination of the actual temperatures utilized for the two processes of FIG. 7 may be determined based on either empirical testing or on crystallization theory combined with the particular phase-change material employed including a volume of the PCM within the PCM cells, a shape and architecture of the phase-change material volume, and various other parameters known to a person of ordinary skill in the art.

In a confined cell that has been fully amorphized (e.g., brought to a RESET state), it is assumed that nucleation is the rate-limiting step (the step that determines subsequent SET success and speed). Crystal growth is assumed to be fast and transpires quickly once a nucleation event has occurred. In order for nucleation to occur, by definition, at least one crystal must emerge within the observation time (SET signal width, $t_{PW}$) and within the available cell volume, V. At any particular temperature and for a given cell volume, the minimum SET signal time, $t_{PW,min}$, is inversely proportional to the material-dependent crystal nucleation rate and occurs only at the optimum temperature. In order to mitigate this issue of the prior art, the correct SET programming procedure for a fully amorphized cell would be required to (1) initiate the nucleation of a (small) crystal with a relatively low temperature programming step; and (2) increase the size of the nucleated crystal by promoting crystal growth at a higher temperature.

As noted above, PCM cells within a PCM array will likely include unavoidable process variations. Therefore, the ramped rising-edge signals discussed above (e.g., FIGS. 6A through 6D) may effectively induce nucleation of crystal seeds even in slightly different PCM cells possibly present in a PCM array.

Figure 8:
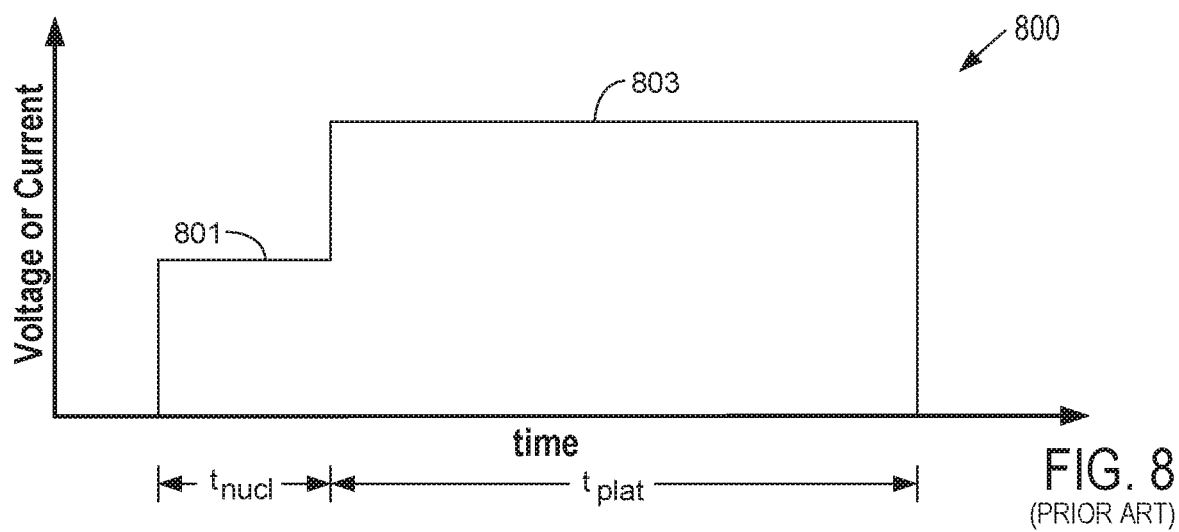
FIG. 8 is a prior art nucleation signal followed by a subsequently-applied SET signal to enhance the nucleation process of a single PCM cell.

A prior art approach that has been considered for the two-step procedure discussed above utilizes a reversed-L, shaped SET signal. With reference now to FIG. 8, a SET signal 800 of the prior art to enhance the nucleation process of a single PCM cell is shown. The SET signal is purported to enhance the nucleation process, but it is tailored only to a single cell since any cell-to-cell variations are not considered. A first lower-level plateau 801 of the signal is used to promote nucleation during a time period $t_{nucl}$. A second higher-level plateau 803 of the signal operates over a time period, $t_{plat}$, to promote crystallization growth of the phase-change material.

This particular two-step prior art approach has been shown to be effective for promoting nucleation first (before growth) in a single PCM cell. However, the amplitudes of the two plateaus 801, 803, must be accurately tailored for a given PCM cell. Significantly, a single set of amplitudes is typically not feasible because of cell-to-cell variation in an array of memory cells. Consequently, the SET signal 800 of FIG. 8 is ineffective at producing a nucleation phase in a typical memory array involving a large number of PCM cells.

However, in various embodiments described herein, various combinations of, for example, one or more of the signals of FIGS. 6A through 6D may be combined to achieve a practical nucleation and/or SET signal for achieving the two-step nucleation-growth process described herein while still allowing for manufacturing variability (e.g., cell-to-cell variations) in a memory array containing large numbers of PCM cells.

Figure 9:
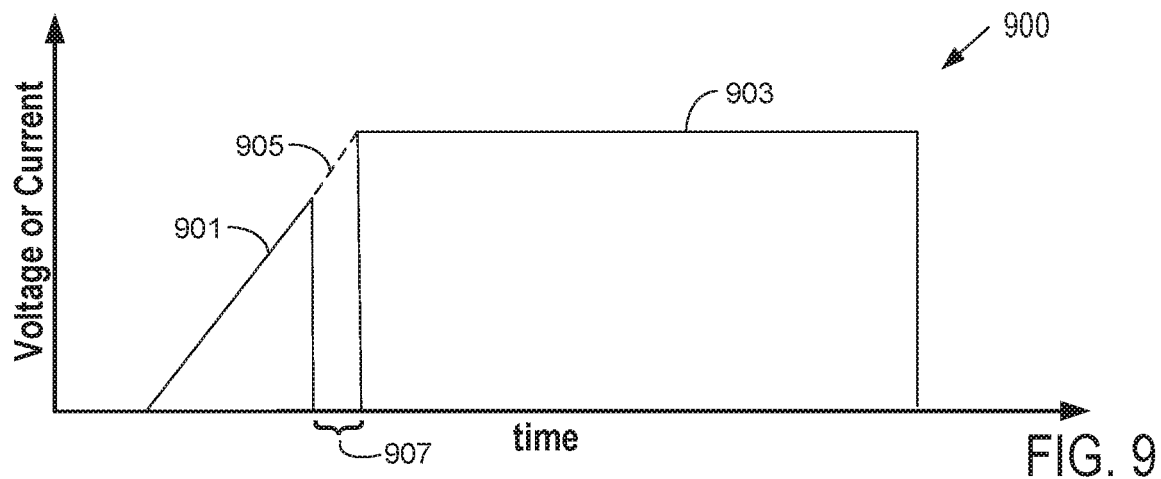
FIG. 9 is an alternative signal shape with separate signals for nucleation and SET signals in accordance with various embodiments described herein to promote nucleation in a plurality of PCM cells while accounting for manufacturing variability between the PCM cells.

With reference now to FIG. 9, an alternative signal shape 900 having separate signal portions for nucleation and SET signal in accordance with various embodiments described herein is shown. The alternative signal shape 900 promotes nucleation in a plurality of PCM cells while accounting for manufacturing variability between the PCM cells. For example, a rising-edge signal portion 901 of the alternative signal shape 900 includes a nucleation phase signal and may also adopt or be a portion of one or more of the signals as shown graphically in FIGS. 6A through 6D. The rising-edge signal portion 901 utilizes a non-zero ramp-up time or rising edge of the signal that is substantially longer than the practical lower limit of the approximately 10 ns ramp-up time discussed above with regard to FIGS. 5A through 5C, above.

With reference to the standard square box SET signal of the prior art (e.g., FIG. 5A), or even the two-step version of the SET signal 800 of FIG. 8, the signal shape 900 includes the rising-edge signal portion 901 followed by a plateau-region signal portion 903. A time-period 907 may occur between the rising-edge signal portion 901 and the plateau-region signal portion 903. As will be understandable to a person of ordinary skill in the art, the time-period 907 may, in an embodiment, cover a zero-delay time period (in which case, a signal portion 905 effectively continues directly to the plateau-region signal portion 903, such as is represented by FIG. 6A). In other embodiments, the time-period 907 may have a non-zero delay. The signal portion 905 may either be part of the nucleation signal or the SET signal, or both, or, after the non-zero delay, the SET signal may simply continue as the plateau-region signal portion 903. In the case of either a zero-delay period or a non-zero delay period, the highest amplitude of the rising-edge signal portion 901 may have a different amplitude or substantially the same amplitude as the plateau-region signal portion 903. For example, in various embodiments, after a non-zero delay period, the rising-edge signal portion 901 may have substantially the same amplitude as the plateau-region signal portion 903.

The rising-edge signal portion 901 allows each of the PCM cells within a memory array to spend more time in the low-temperature regime conducive to nucleation formation. The low-temperature region of the rising-edge signal portion 901 allows nucleation probability to reach its maximum within each of the cells. After having promoted the initial nucleation process within the cells, the higher temperatures of the plateau-region signal portion 903 enhances crystal growth within each cell, thus completing the crystallization process to a desired level for programming selected ones of the PCM cells within an array.

The skilled artisan will recognize that the signal shape 900 of FIG. 9 make take on a variety of shapes and that the signal shape 900 as shown is just one variation. Although not shown explicitly, one or more of the signals of FIGS. 6A through 6D may be utilized along with a reversed-L shaped SET signal having a rising-edge for the first level, as opposed to the nearly instantaneous rising edge of the SET signal 800 of FIG. 8.

Figures 10A, 10B:
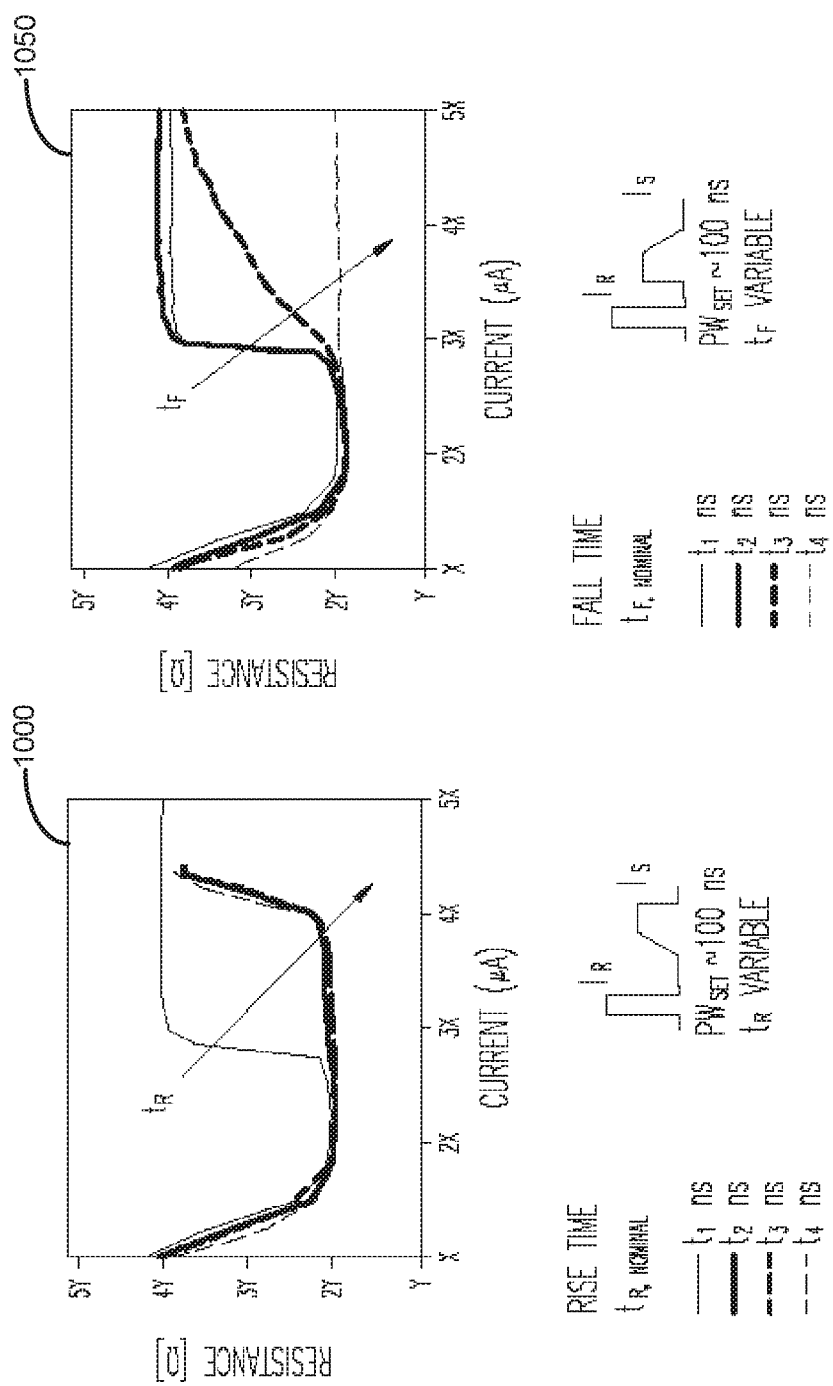
FIGS. 10A and 10B show a number of programming curves obtained with different SET signals for both rise times and fall times for a variety of time periods.

Referring now to FIGS. 10A and 10B, a number of programming curves obtained with different SET signals are shown for both rise times and fall times for a variety of time periods. A variable rise-time signal graph 1000 is in accordance with various ones of the embodiments described herein. A nearly-instantaneous leading-edge signal graph 1050 of FIG. 10B is in accordance with programming schemes employed by the prior art. Each of FIGS. 10A and 10B show a signal consisting of a set signal, $I_S$, having a plateau region of approximately 100 ns in duration, preceded by a RESET pre-condition signal, $I_R$, having a total signal duration of approximately 100 ns. Also note that both FIGS. 10A and 10B use the same SET signal energy and are therefore equivalent from a power consumption perspective. However, in the variable rise-time signal graph 1000 of FIG. 10A, a duration of the rise time varies from $t_1$ to $t_5$, providing a much-wider current window in which to form nucleation regions. In contrast, the nearly-instantaneous leading-edge signal graph 1050 of FIG. 10B a duration of the fall time varies from $t_1$ to $t_5$.

More specifically, note that both FIGS. 10A and 10B vary the rise (or fall) time between $t_1$ and $t_5$ in this experiment. However, note that times $t_2$ and $t_3$ of FIG. 10A have successfully maintained a wider current window as opposed to the curves for the equivalent times in FIG. 1.0B that use substantially the same overall pulse energy. Consequently, with the rising-edge signal portion of FIG. 10A, a rise time of $t_2$ is sufficient to crystallize the molecules within the cell. However, for FIG. 10B, the time required is at least t4, which represents at least 10 times the total time period required for successfully applying a SET signal as compared with FIG. 10A.

Thus, with concurrent reference to FIG. 6A and FIGS. 5A through 5C, FIG. 10A indicates benefits associated with the applying the signal of, for example, the rising-edge signal 600 of FIG. 6A to PCM cells. For example, FIGS. 10A and 10B compare the rising-edge signal 600 to the signal 500 of FIG. 5A or the triangular signal 510 of FIG. 5B or the combined signal 520 of FIG. 5C in a fully confined phase-change memory cell. For example, for a particular architecture of a memory cell at currents lower than a given value, i, the temperature inside the cell obtained on the plateau of the SET signal corresponds to the region where nucleation is highly effective and the plateau duration of $t_2$ is sufficient to crystallize the molecules within the cell as shown in FIG. 10A. However, for currents higher than the given value i, nucleation is no longer effective, and a square SET signal (approximated by $t_{rise}=t_1$, corresponding to the signal 500 of FIG. 5A and as indicated by the graph of FIG. 10B, cannot set the cells to a low threshold voltage or resistance. Therefore, if no crystal seed is present to initiate the growth process, no crystallization can take place nearly as rapidly as shown in FIG. 10A.

By increasing the rising edge time of the signal (e.g., $t_{rise} \geq t_2$) as shown in FIG. 10A, the crystal seeds can be initiated during the ramp-up time, and the SET state can easily be achieved also in this region (leading to a low resistance). Therefore, FIGS. 10A and 10B indicate that a ramp-up signal is more efficient than a ramp-down signal.

Figure 11:
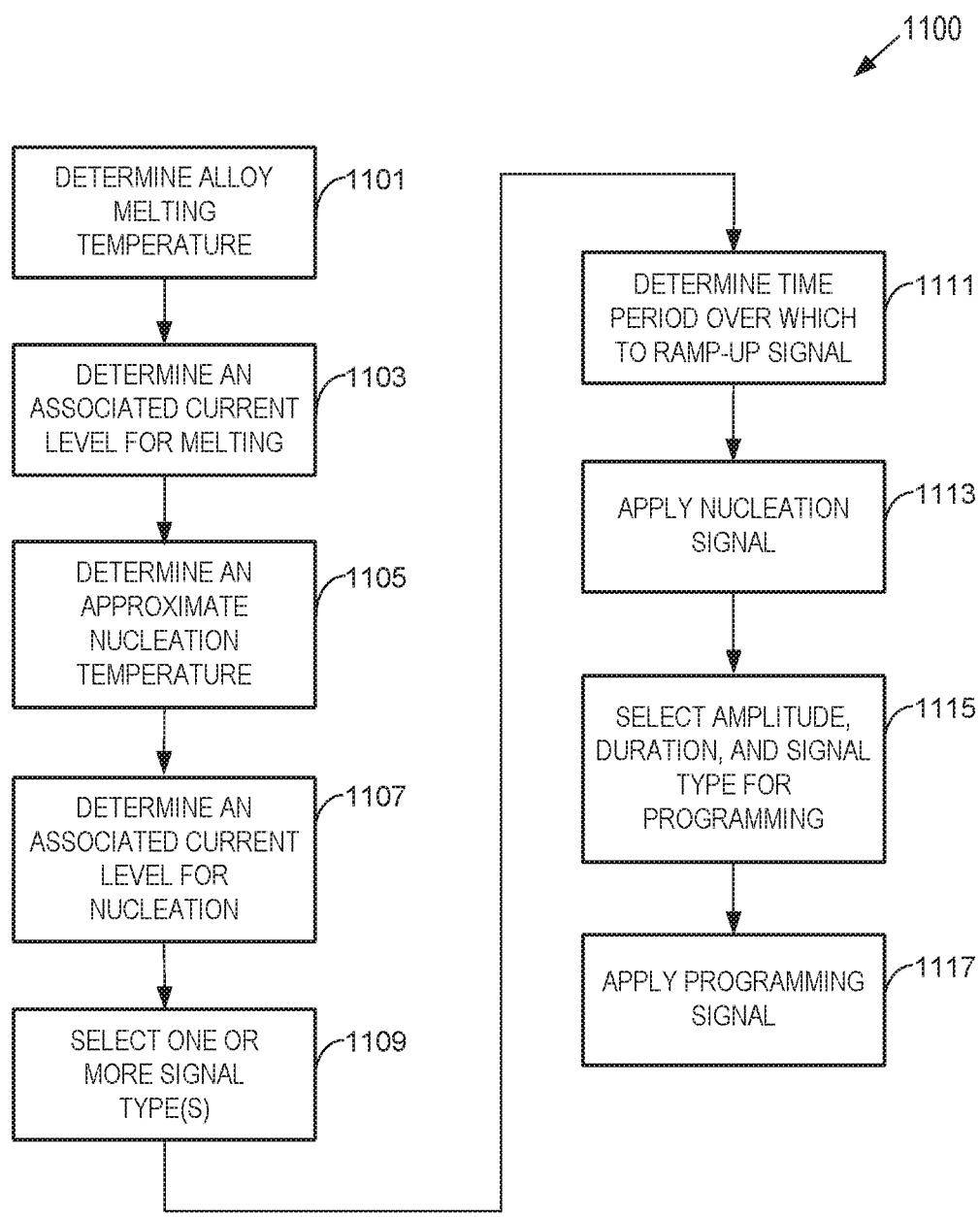
FIG. 11 is a flowchart showing an embodiment of a method to implement nucleation phases and subsequent crystal growth in PCM cells in accordance with various embodiments described herein.

FIG. 11 is a flowchart 1100 showing an embodiment of a method to implement nucleation phases and programming of PCM cells in accordance with various embodiments described herein. The method may be applied to and utilized by various types of memory arrays, such as the memory arrays 102 of FIG. 1. A person of ordinary skill in the art will understand that the flowchart provides only one possible chronological occurrence of the various operations. The skilled artisan, upon reading and understanding the disclosure provided herein will recognize that many of the operations may be performed in a different order, certain operations may be performed in parallel with other operations, or some operations may be considered to be optional (e.g., operations 1101 through 1111 and 1115 may be carried out during a development phase of PCM array development while applying a combined or separate nucleation and programming SET signals). Further, upon reading and understanding the disclosure provided herein, the skilled artisan will further recognize that the flowchart 1100 may be implemented, for example, within the memory control unit 118 of FIG. 1, or in a controller 1203, discussed below with reference to FIG. 12. Although not shown specifically, in art embodiment, the memory control unit 118 and the controller 1203 may include a nucleation signal generator and a programming signal generator. The generated nucleation signal and programming signal may each be formed by the same generator or may be formed by separate generators. For example, in one embodiment, the nucleation signal generator may provide a continuously-increasing rising-edge signal (e.g., such as the non-zero rising-edge signal of FIGS. 6A through 6D and FIG. 9). In another embodiment, the nucleation signal generator may provide a step-wise increasing rising-edge signal. However, the nucleation signal generator may also be utilized to generate the programming signal. In some embodiments, the type of rising-edge nucleation signal and SET programming single may be field-selectable from within the memory control unit 118 or the controller 1203 for particular types of SET resistance values selected. Therefore, the flowchart 1100 is provided simply to illuminate various operations that may be considered.

With continuing reference to FIG. 11, at operation 1101, a melting temperature of the phase-change material alloy used within the PCM cells is determined. Generally, melting temperatures may be known a priori for a given alloy. At operation 1103, a determination of a current level necessary to bring the PCM alloy to melting temperature is made. The determination of current is based, at least partially, on both the structure (e.g., shape) and volume of the phase-change material within the cell. Subsequent selections of an amplitude of nucleation signal amplitudes and programming signal amplitudes are generally adjusted to be below the current level necessary to bring the PCM alloy to melting temperature.

At operation 1105, an approximate temperature is determined that allows cells within the memory array to remain within the nucleation phase (e.g., effectively nucleate crystals) based on nucleation probability (e.g., see FIG. 7). However, since a single temperature of nucleation cannot be determined that will be optimal for each of the PCM cells within the memory array, the selected approximate temperature provides for the pre-structural ordering of molecules within the phase-change material alloy while remaining generally within the nucleation probability phase 701 of FIG. 7 while avoiding too high of temperature that will begin placing the cells within the crystalline growth phase 703. The determination of the approximate temperature to remain within the nucleation phase 701 is based, at least partially, on the structure (e.g., shape), volume, and/or type of the phase-change material within the cell. A determination of the crystallization probability as a function of temperature for phase-change materials may only be approximately determined based on given phase-change materials and corresponding interfaces with neighboring materials. Therefore, a final determination of the values of operations 1101 through 1107 may be empirically determined by, for example, an experiment that loops through all possible amplitudes and all possible rise/fall times (using reasonable ranges and step sizes which would be known to a person of ordinary skill in the art). Consequently, an a priori knowledge of crystallization rates is not necessary. The empirical experiment could be conducted on an entire array and the values could then be selected therefrom for a given array/material type.

At operation 1107, a determination of a current level associated with the desired approximate temperature determined at operation 1105 to place the PCM cells of the memory array within the nucleation phase is made. A selection of one or more of the signal types (e.g., the various signals described with reference to FIGS. 6A through 6D and/or FIG. 9) to provide for nucleation is then made at operation 1109.

Based on at least the shape, volume, and alloy type selected for the PCM cells, a determination of a time period in which to ramp-up a signal is made at operation 1111. The determination of the time period is further based on either an expected, calculated, or measured manufacturing variability and tolerances of the PCM cells within an array. The selected signal may then be applied to the PCM cells within the memory array at operation 1113.

When a determination is made to program various ones of the PCM cells within the memory array, an amplitude, duration, and signal type for a programming signal are selected at operation 1115. The selection of the amplitude, duration, and signal type parameters chosen to effect a desired level of crystal growth within the one or more cells. The selection of parameters may be known independently to a person of ordinary skill in the art or, alternatively, or in conjunction, may be determined empirically. The programming signal is then applied to appropriate ones of the PCM cells at operation 1117. As discussed above, the nucleation signal and the programming signal may be combined into a single signal.

Figure 12:
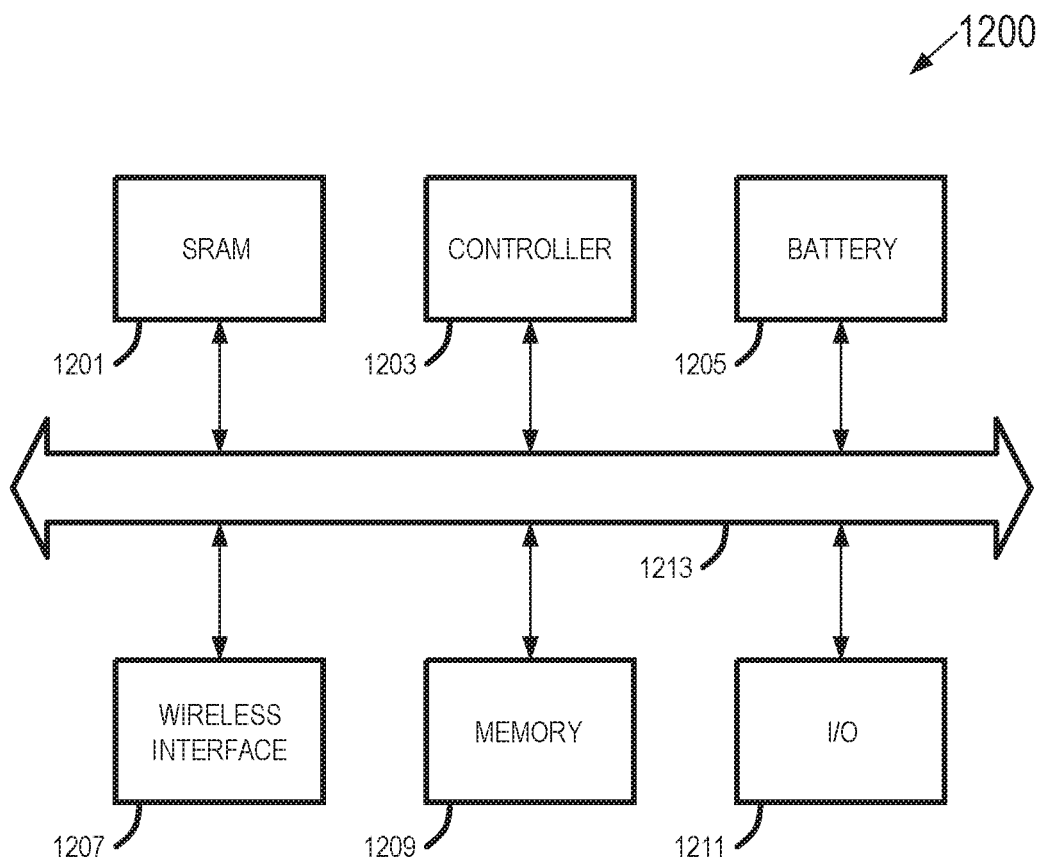
FIG. 12 shows a block diagram of a system embodiment, including a memory device in accordance with the embodiments described herein.

With reference now to FIG. 12, a block diagram of an illustrative embodiment of an apparatus in the form of an electronic system 1200 including one or more memory devices (e.g., the memory device 101 of FIG. 1) is shown. The electronic system 1200 may be used in devices such as, for example, a personal digital assistant (PDA), a laptop or portable computer with or without wireless capability, a web tablet, a wireless telephone, a pager, an instant messaging device, a digital music player, a digital camera, or other devices that may be adapted to transmit or receive information either wirelessly or over a wired connection. The electronic system 1200 may be used in any of the following systems: a wireless local area network (WLAN) system, a wireless personal area network (WPAN) system, or a cellular network.

The electronic system 1200 of FIG. 12 is shown to include the controller 1203 (briefly discussed above), an input/output (I/O) device 1211 (e.g., a keypad, a touchscreen, or a display), a memory device 1209, a wireless interface 1207, and a static random access memory (SRAM) device 1201 all coupled to each other via a bus 1213. A battery 1205 may supply power to the electronic system 1200 in one embodiment. The memory device 1209 may include a NAND memory, a flash memory, a NOR memory, a combination of these, or the like, as well as one or more of the memory devices described herein.

The controller 1203 may include, for example, one or more microprocessors, digital signal processors, micro-controllers, or the like. Further, upon reading and understanding the disclosure provided herein, the skilled artisan will recognize that the flowchart 1100 of FIG. 11, discussed above, may be implemented in the controller 1203. The memory device 1209 may be used to store information transmitted to or by the electronic system 1200. The memory device 1209 may optionally also be used to store information in the form of instructions that are executed by the controller 1203 during operation of the electronic system 1200 and may be used to store information in the form of user data either generated, collected, or received by the electronic system 1200 (such as image data). The instructions may be stored as digital information and the user data, as disclosed herein, may be stored in one section of the memory as digital information and in another section as analog information. As another example, a given section at one time may be labeled to store digital information and then later may be reallocated and reconfigured to store analog information. The controller 1203 may include one or more of the memory devices described herein.

The I/O device 1211 may be used to generate information. The electronic system 1200 may use the wireless interface 1207 to transmit and receive information to and from a wireless communication network with a radio frequency (RF) signal. Examples of the wireless interface 1207 may include an antenna, or a wireless transceiver, such as a dipole or patch antenna. However, the scope of the subject matter is not limited in this respect. Also, the I/O device 1211 may deliver a signal reflecting what is stored as either a digital output (if digital information was stored), or as an analog output (if analog information was stored). While an example in a wireless application is provided above, embodiments of the subject matter disclosed herein may also be used in non-wireless applications as well. The 110 device 1211 may include one or more of the memory devices programmed as described herein.

The various illustrations of the methods and apparatuses herein are intended to provide a general understanding of the structure of various embodiments and are not intended to provide a complete description of all the elements and features of the apparatuses and methods that might make use of the structures, features, and materials described herein.

The apparatuses of the various embodiments may include or be included in, for example, electronic circuitry used in high-speed computers, communication and signal processing circuitry, single or multi-processor modules, single or multiple embedded processors, multi-core processors, data switches, and application-specific modules including multi-layer, multi-chip modules, or the like. Such apparatuses may further be included as sub-components within a variety of electronic systems, such as televisions, cellular telephones, personal computers (e.g., laptop computers, desktop computers, handheld computers, tablet computers, etc.), workstations, radios, video players, audio players, vehicles, medical devices (e.g., heart monitors, blood pressure monitors, etc.), set top boxes, and various other electronic systems.

A person of ordinary skill in the art will appreciate that, for this and other methods (e.g., programming or read operations) disclosed herein, the activities forming part of various methods may be implemented in a differing order, as well as repeated, executed simultaneously, or substituted one for another. Further, the outlined acts and operations are only provided as examples, and some of the acts and operations may be optional, combined into fewer acts and operations, or expanded into additional acts and operations without detracting from the essence of the disclosed embodiments.

The present disclosure is therefore not to be limited in terms of the particular embodiments described in this application, which are intended as illustrations of various aspects. For example, instead of using floating gates as a charge storage structure, charge traps may be used instead. Many modifications and variations can be made, as will be apparent to a person of ordinary skill in the art upon reading and understanding the disclosure. Functionally equivalent methods and apparatuses within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow a reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method of programming phase-change memory (PCM) cells within a memory array, the method comprising:
   applying a nucleation signal and a programming signal to the PCM cells, the nucleation signal resulting in nucleation sites being formed within the PCM cells, the nucleation sites being a pre-structural ordering of molecules of PCM material within the PCM cells, the pre-structural ordering occurring prior to the molecules being placed in a subsequent crystalline-growth phase;
   wherein the nucleation signal includes an initial ramp-up portion having a rising leading edge leading to a maximum amplitude of the nucleation signal, wherein the rising leading edge is longer than 10 nanoseconds, and
   wherein the programming signal begins at an amplitude at least as great as the maximum amplitude of the nucleation signal, and extends for a selected period of time to achieve a desired level of crystallinity within the PCM cells receiving the nucleation signal and the programming signal.

2. The method of claim 1, wherein the nucleation signal and the programming signal are contiguous in a combined nucleation and programming signal, and wherein the programming signal begins at the maximum amplitude of the nucleation signal and extends for a selected period of time.

3. The method of claim 2, wherein the programming signal of the combined nucleation and programming signal maintains the maximum amplitude for a selected period of time.

4. The method of claim 2, wherein after the selected period of time, the programming signal of the combined nucleation and programming signal returns to zero at the trailing edge of the signal.

5. The method of claim 2, wherein the programming signal of the combined nucleation and programming signal comprises a ramp down trailing edge signal from the maximum amplitude over a predetermined time period.

6. The method of claim 5, wherein the ramp down trailing edge signal begins upon the nucleation signal of the combined nucleation and programming signal achieving the maximum amplitude.

7. The method of claim 5, wherein the programming signal of the combined nucleation and programming signal maintains the maximum amplitude for a pre-determined time before the ramp down trailing edge signal.

8. The method of claim 1, wherein the maximum amplitude is selected to provide a lower current level than that which would induce partial or complete melting of the phase change material within the PCM cells.

9. The method of claim 1, wherein the nucleation signal and the programming signal are separate signals.

10. The method of claim 9, further comprising a time interval between the nucleation signal reaching the maximum amplitude and the start of the programming signal; and wherein the initial amplitude of the programming signal is greater than the maximum amplitude of the nucleation signal.

11. An apparatus comprising:
   multiple phase-change memory (PCM) cells; and
   at least one signal generator in at least selective communication with one or more of the PCM cells, the at least one signal generator configured to apply a nucleation signal and a programming signal to the PCM cells, the nucleation signal configured to result in nucleation sites within a PCM cell receiving the nucleation signal, the nucleation sites being a pre-structural ordering of molecules of PCM material within the PCM cells, the pre-structural ordering occurring prior to the molecules being placed in a subsequent crystalline-growth phase;
   wherein the nucleation signal includes an initial ramp-up nucleation portion having a rising leading edge leading to a maximum amplitude of the nucleation signal, the rising leading edge lasting longer than 10 nanoseconds; and
   wherein the programming signal begins at an amplitude at least as great as the maximum amplitude of the nucleation signal, and extends for a selected period of time to achieve a desired level of crystallinity within a PCM cell receiving the nucleation signal and the programming signal.

12. The apparatus of claim 11, wherein the at least one signal generator applying the nucleation signal and the programming signal comprises a single signal generator providing both the nucleation signal and the programming signal.

13. The apparatus of claim 11, wherein the at least one signal generator comprises a first signal generator providing the nucleation signal, and a second signal generator providing the programming signal.

14. The apparatus of claim 11, wherein the at least one signal generator generates the nucleation signal and the programming signal as a continuous combined nucleation and programming signal.

15. The apparatus of claim 14, wherein the programming signal begins at the maximum amplitude of the nucleation signal and extends for a selected period of time.

16. The apparatus of claim 11, wherein the nucleation signal and the programming signal are separate from one another.

17. The apparatus of claim 15, wherein after the selected period of time, the programming portion of the combined nucleation and programming signal returns to zero at the trailing edge of the signal.

18. The apparatus of claim 15, wherein the programming signal of the combined nucleation and programming signal comprises a ramp down trailing edge signal from the maximum amplitude over a predetermined time period.

19. The apparatus of claim 18, wherein the ramp down trailing edge signal begins upon the nucleation signal achieving the maximum amplitude.

20. The apparatus of claim 19, wherein the programming signal of the combined nucleation and programming signal maintains the maximum amplitude for a pre-determined time before the ramp down trailing edge signal.

21. The apparatus of claim 16, further comprising a time interval between the nucleation signal reaching the maximum amplitude and the start of the programming signal; and wherein the initial amplitude of the programming signal is greater than the maximum amplitude of the nucleation signal.

* * * * *